United States Patent
Hazelton et al.

(10) Patent No.: US 6,252,234 B1
(45) Date of Patent: Jun. 26, 2001

(54) REACTION FORCE ISOLATION SYSTEM FOR A PLANAR MOTOR

(75) Inventors: Andrew J. Hazelton, San Carlos, CA (US); Keiichi Tanaka, Funabashi (JP); Yutaka Hayashi, Yokohama (JP); Nobukazu Ito, Matudo (JP)

(73) Assignee: Nikon Corporation (JP)

( * ) Notice: Subject to any disclaimer, the term of this patent is extended or adjusted under 35 U.S.C. 154(b) by 0 days.

(21) Appl. No.: 09/134,278

(22) Filed: Aug. 14, 1998

(51) Int. Cl.[7] ............................. G01F 23/00; G01K 5/08
(52) U.S. Cl. ........................................ 250/442.11; 318/53
(58) Field of Search ........................ 355/53; 250/492.2, 250/492.23; 318/586, 687

(56) References Cited

U.S. PATENT DOCUMENTS

| | | |
|---|---|---|
| Re. 27,289 | 2/1972 | Sawyer . |
| Re. 27,436 | 7/1972 | Sawyer . |
| 3,851,196 | 11/1974 | Hinds . |
| 4,535,278 * | 8/1985 | Asakawa ............................. 318/687 |
| 4,555,650 | 11/1985 | Asakawa . |
| 4,654,571 * | 3/1987 | Hinds ................................. 318/687 |
| 4,958,115 | 9/1990 | Miller . |
| 5,196,745 | 3/1993 | Trumper . |
| 5,260,580 * | 11/1993 | Itoh et al. ........................ 250/492.2 |
| 5,334,892 | 8/1994 | Chitayat . |
| 5,446,519 | 8/1995 | Makinouchi . |
| 5,477,304 * | 12/1995 | Nishi ................................... 355/53 |
| 5,504,407 | 4/1996 | Wakui et al. . |
| 5,528,118 * | 6/1996 | Lee ................................ 318/586.17 |
| 5,744,924 | 4/1998 | Lee . |
| 5,760,561 | 6/1998 | Chinju et al. . |
| 5,777,721 | 7/1998 | Makinouchi . |
| 5,874,820 | 2/1999 | Lee . |
| 5,939,852 | 8/1999 | Akutsu et al. . |

OTHER PUBLICATIONS

Japanese Patent Abstracts (total 22 pages) re linear and planar motor.

* cited by examiner

*Primary Examiner*—Jack Berman
*Assistant Examiner*—Johnnie L Smith, II
(74) *Attorney, Agent, or Firm*—Morrison & Foerster LLP

(57) ABSTRACT

The present invention provides a structure for isolating the reaction forces generated by a planar motor. Specifically, the fixed portion of the reaction motor, which is subject to reaction forces, is structurally isolated from the rest of the system in which the planar motor is deployed. In accordance with one embodiment of the present invention, the fixed portion of the planar motor is separated from the rest of the system and coupled to ground. The rest of the system is isolated from ground by deploying vibration isolation means. Alternatively or in addition, the fixed portion of the planar motor may be structured to move (e.g., on bearings) in the presence of reaction forces, so as to absorb the reaction forces with its inertia. In a further embodiment of the present invention, the fixed portion of the planar motor and the article to be moved are supported by the same frame, with the fixed portion of the planar motor movable on bearings.

28 Claims, 7 Drawing Sheets

REACTION FORCE ISOLATION SYSTEM FOR A PLANAR MOTOR

BACKGROUND OF THE INVENTION

1. Field of the Invention

The present invention relates, in general, to planar motor driven positioning systems, and more particularly to such method and apparatus for positioning and aligning a wafer in a photolithographic system using a planar motor and isolating the system from the reaction forces of the planar motor.

2. Related Background Art

Various support and positioning structures are available for positioning an article for precision processing. For example in semiconductor manufacturing operations, a wafer is precisely positioned with respect to a photolithographic apparatus. In the past, planar motors have been advantageously utilized to position and align a wafer stage for exposure in the photolithographic apparatus. For example, U.S. Pat. Nos. 4,535,278 and 4,555,650 to Asakawa describe the use of planar motors in a semiconductor manufacturing apparatus.

A semiconductor device is typically produced by overlaying or superimposing a plurality of layers of circuit patterns on the wafer. The layers of circuit patterns must be precisely aligned. Several factors may cause alignment errors. Vibrations of the structures within the photolithographic system could cause misalignment of the wafer. The reaction forces between the moving portion and fixed portion of the planar motor are known to induce vibrations in the system.

As the semiconductor manufacturing industry continues to try to obtain increasingly tighter overlays due to smaller overlay budgets and finer conductor widths, the importance of alignment has been magnified. Precise alignment of the overlays is imperative for high resolution semiconductor manufacturing. It is therefore desirable to develop a means to reduce the effect of vibrations caused by the planar motor.

SUMMARY OF THE INVENTION

The present invention provides a structure for isolating the vibrations induced by reaction forces generated by a planar motor. Specifically, the fixed portion of the reaction motor, which is subject to reaction forces, is structurally isolated from the rest of the system in which the planar motor is deployed. This can be done in a number of ways.

In accordance with one embodiment of the present invention, the fixed portion of the planar motor is separated from the rest of the system and coupled to ground. The rest of the system is isolated from ground by deploying a vibration isolation system. Alternatively or in addition, the fixed portion of the planar motor may be structured to move (e.g., on bearings) in the presence of reaction forces, so as to absorb the reaction forces with its inertia.

In a further embodiment of the present invention, the fixed portion of the planar motor and the article to be moved are supported by the same frame, with the fixed portion of the planar motor movable on bearings.

DETAIL DESCRIPTION OF THE ILLUSTRATED EMBODIMENT

The following description is of the best-contemplated mode of carying out the invention. This description is made for the purpose of illustrating the general principles of the invention and should not be taken in a limiting sense. The scope of the invention is best determined by reference to the appended claims.

To illustrate the principles of the present invention, the isolation of vibrations induced by reaction forces generated by a planar motor is described in reference to a scanning-type photolithography system for substrate processing. However, it is understood that the present invention may be easily adapted for use in other types of exposure systems for substrate processing (e.g., projection-type photolithography system or electron-beam (EB) photolithography system disclosed in U.S. Pat. No. 5,773,837) or other types of systems (e.g. pattern position measurement system disclosed in U.S. Pat. No. 5,539,521, wafer inspection equipment, machine tools, electron beam, microscope) for processing other articles in which the reduction of vibrations induced by reaction forces generated in a planar motor is desirable without departing from the scope and spirit of the present invention.

Figure 1:
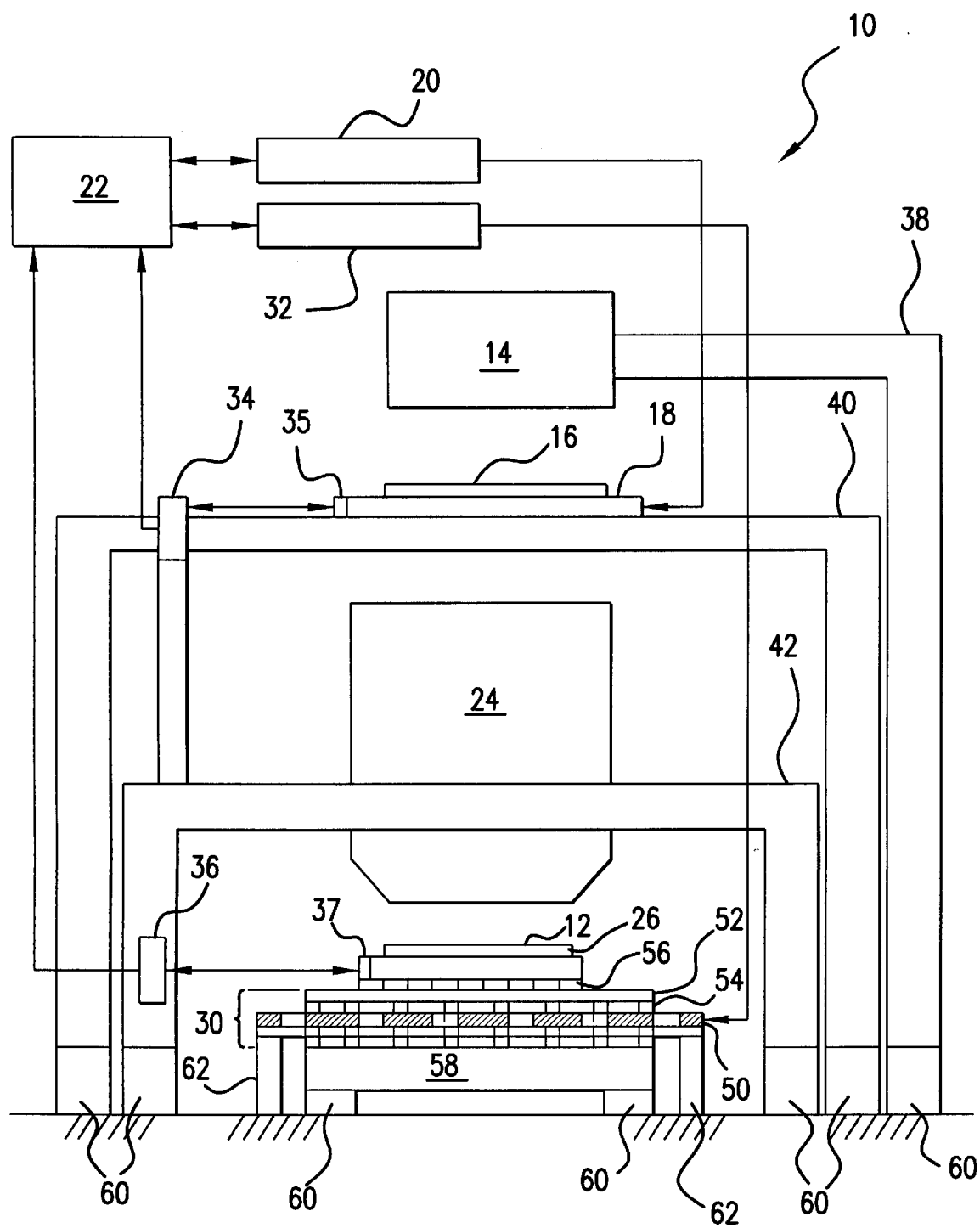
FIG. 1 is a schematic representation of a planar motor driven scanning type exposure system that implements a reaction force isolation system in accordance with one embodiment of the present invention.

FIG. 1 is a schematic representation of a scanning-type exposure system 10 for processing a substrate, such as a wafer 12, which implements the present invention. In an illumination system 14, light beams emitted from an extra-high pressure mercury lamp are converged, collimated and filtered into substantially parallel light beams having a wavelength needed for a desired exposure (e.g., exposure of the photoresist on the wafer 12). Of course, in place of the mercury lamp, excimer laser (Krf, Arf or F2) can be used.

The light beams from the illumination system 14 illuminates a pattern on a reticle 16 that is mounted on a reticle stage 18. The reticle stage 18 is movable in several (e.g., three to six) degrees of freedom by servomotors or linear motor (not shown) under precision control by a driver 20 and a system controller 22. The structure of the reticle stage 18 is disclosed in U.S. application Ser. No. 08/698,827. The light beams penetrating the reticle 16 are projected on the wafer 12 via projection optics 24.

The wafer 12 is held by vacuum suction on a wafer holder (not shown) that is supported on a wafer stage 26 under the projection optics 24. The wafer stage 26 is structured so that it can be moved in several (e.g., three to six) degrees of freedom by a planar motor 30 (see also FIG. 2) under precision control by the driver 32 and system controller 22, to position the wafer 12 at a desired position and orientation, and to move the wafer 12 relative to the projection optics 24. The driver 32 may provide the user with information relating to X, Y and Z positions as well as the angular positions of the wafer 12 and the driver 20 may provide user with information relating to the position of the reticle 16. For precise positional information, interferometers 34 and 36 and mirrors 35 and 37 are provided for detecting the actual positions of the reticle and wafer, respectively.

In the scanning-type exposure apparatus, the reticle 16 and the wafer 12 are scanned and exposed synchronously (in accordance with the image reduction in place) with respect to an illumination area defined by a slit having a predetermined geometry (e.g., a rectangular, hexagonal, trapezoidal or arc shaped slit). This allows a pattern larger than the slit-like illumination area to be transferred to a shot area on the wafer 12. After the first shot area has been completed, the wafer 12 is stepped by the planar motor 30 to position the following shot area to a scanning start position. This system of repeating the stepping and scanning exposure is called a step-and-scan system. The scan-type exposure method is especially useful for imaging large reticle patterns and/or large image fields on the substrate, as the exposure area of the reticle and the image field on the wafer are effectively enlarged by the scanning process.

It is again noted that the configuration of the exposure system 10 described above generally corresponds to a step-and-scan exposure system that is known in the art. Further detail of the components within a scanning-type exposure apparatus may be referenced from U.S. Pat. No. 5,477,304 to Nishi and U.S. Pat. No. 5,715,037 to Saiki et al. (assigned to the assignee of the present invention, which are fully incorporated by reference herein. It is to be understood that the present invention disclosed herein is not to be limited to wafer processing systems, and specifically to step-and-scan exposure systems for wafer processing. The general reference to a step-and-scan exposure system is purely for illustrating an embodiment of an environment in which the concept of isolation of planar motor reaction forces to reduce system vibration may be advantageously adopted.

As illustrated in the FIG. 1, the illumination system 14, the reticle stage 18 and the projection optics 24 are separately supported by frames 38, 40 and 42, respectively. The frames are coupled to the "ground" (or the surface on which the overall exposure system is supported). As will be noted below, the frames 38, 40 and 42 may be coupled to the ground by means of vibration isolation systems and the like.

Figure 2:
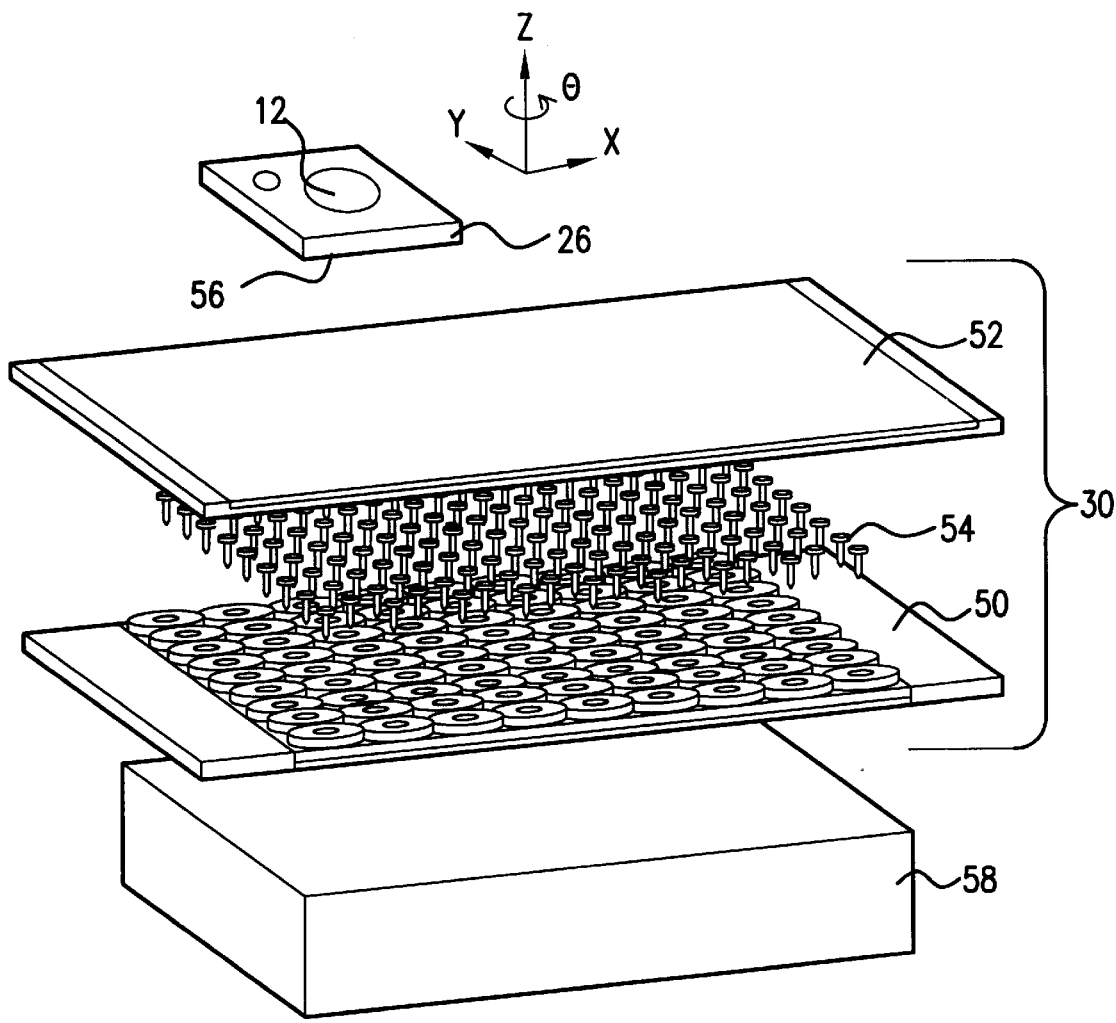
FIG. 2 is a schematic exploded view of one embodiment of the planar motor adopted in the system in FIG. 1.

Referring also to FIG. 2, the components of the planar motor 30 are schematically illustrated. The planar motor 30 comprises an array 50 of magnetic coils that are electrically energized under control of the driver 32. A top plate 52 is positioned above the coil array 50. The top plate 52 may be made of non-magnetic materials, for example, carbon fiber plastics, ceramics such as Zerodur ceramics, $Al_2O_3$ ceramics, and the like materials that do not impair the magnetic flux of permanent magnets 56. The wafer stage 26 rests on the top plate 52 (preferably in the presence of an air bearing). The underside of the wafer stage 26 has an array of permanent magnets 56 configured to interact with the coil array 50 to produce forces in the X, Y and θ directions to move the wafer stage 26 across the top plate 52. Consequently, a reaction force acts on the coil array 50. According to the present invention, this reaction force is isolated from the rest of the exposure system 10.

For simplicity, many details of the planar motor are omitted from the FIG. 2, as they alone do not constitute a part of the present invention. Structural details and operational principles of planar motors may be referenced to the prior art, such as the U.S. Pat. Nos. 4,535,278 and 4,555,650 to Asakawa, which are fully incorporated by reference herein.

In the embodiment shown in FIG. 1 and further illustrated in FIG. 2, the top plate 52 is supported on support posts 54 that project through clearance holes in the coil array 50. The support posts 54 rest on a base 58 to prevent it from bending. Alternately, the top plate 52 and the support posts 54 may be a unitary structure. The base 58 is coupled to the ground by damping means 60, such as air or oil dampers, voice coil motors, actuators or other known vibration isolation systems. Similarly, the frames 38, 40 and 42 may be coupled to the ground by similar damping means. The coil array 50 is separately and rigidly coupled to the ground by fixed stands 62. In this embodiment, when reaction forces are created between the coil array 50 and the wafer stage 26, the reaction forces push against the ground. Because of the large mass of the ground, there is very little movement of the coil array 50 from the reaction forces. By providing damping means 60 to couple the base 58 and the frames 38, 40 and 42 to the ground, any vibration that may be induced by the reaction forces through the ground is isolated from the rest of the system 10.

Figure 3:
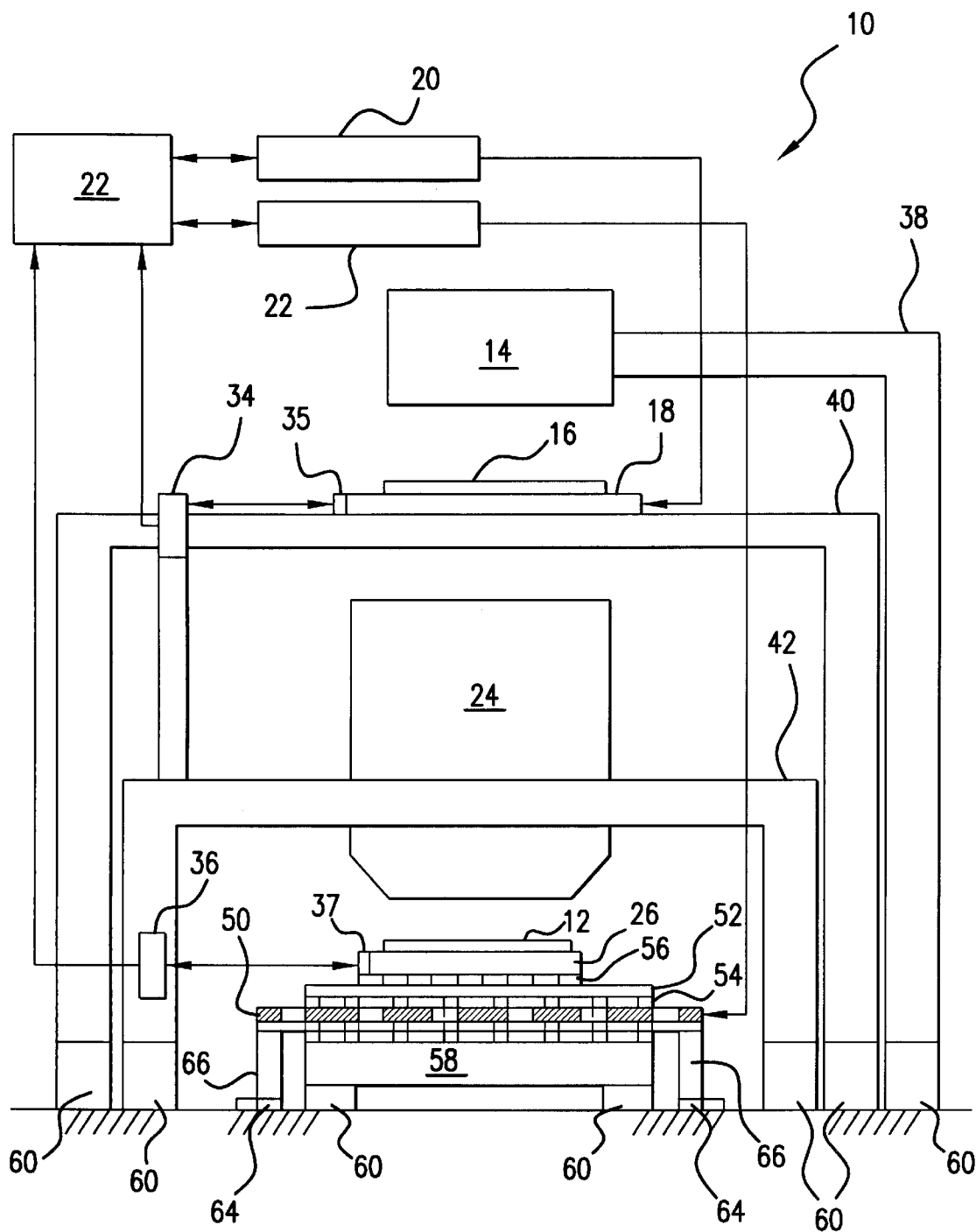
FIG. 3 is a schematic representation of the projection exposure system that implements another embodiment of planar motor reaction force isolation system in which the coil array is supported on bearings.

Referring to FIG. 3, instead of rigidly coupling the coil array to the ground, a bearing coupling may be used. For example, a planar (X, Y and Theta Z) journal bearing 64 may be provided at the end of the supports 66. Ball bearings and air bearings may also be used. When reaction forces are created by the coils between the wafer stage 26 and the coil array 50, both the wafer stage 26 and the coil array 50 move in opposite directions. The mass of the coil array 50 is typically substantially larger than that of the wafer stage 26. Consequently, in accordance with conservation of momentum, the movement of the coil array 50 caused by the reaction force is typically substantially smaller than the movement of the wafer stage 26 under the same reaction force. The inertia of the coil array 50 would absorb the reaction forces. It is to be understood that in the embodiment of FIG. 3, the damping means 60 may be omitted if the bearing support can effectively isolate all reaction forces that may induce vibrations in the rest of the system 10.

Figure 4:
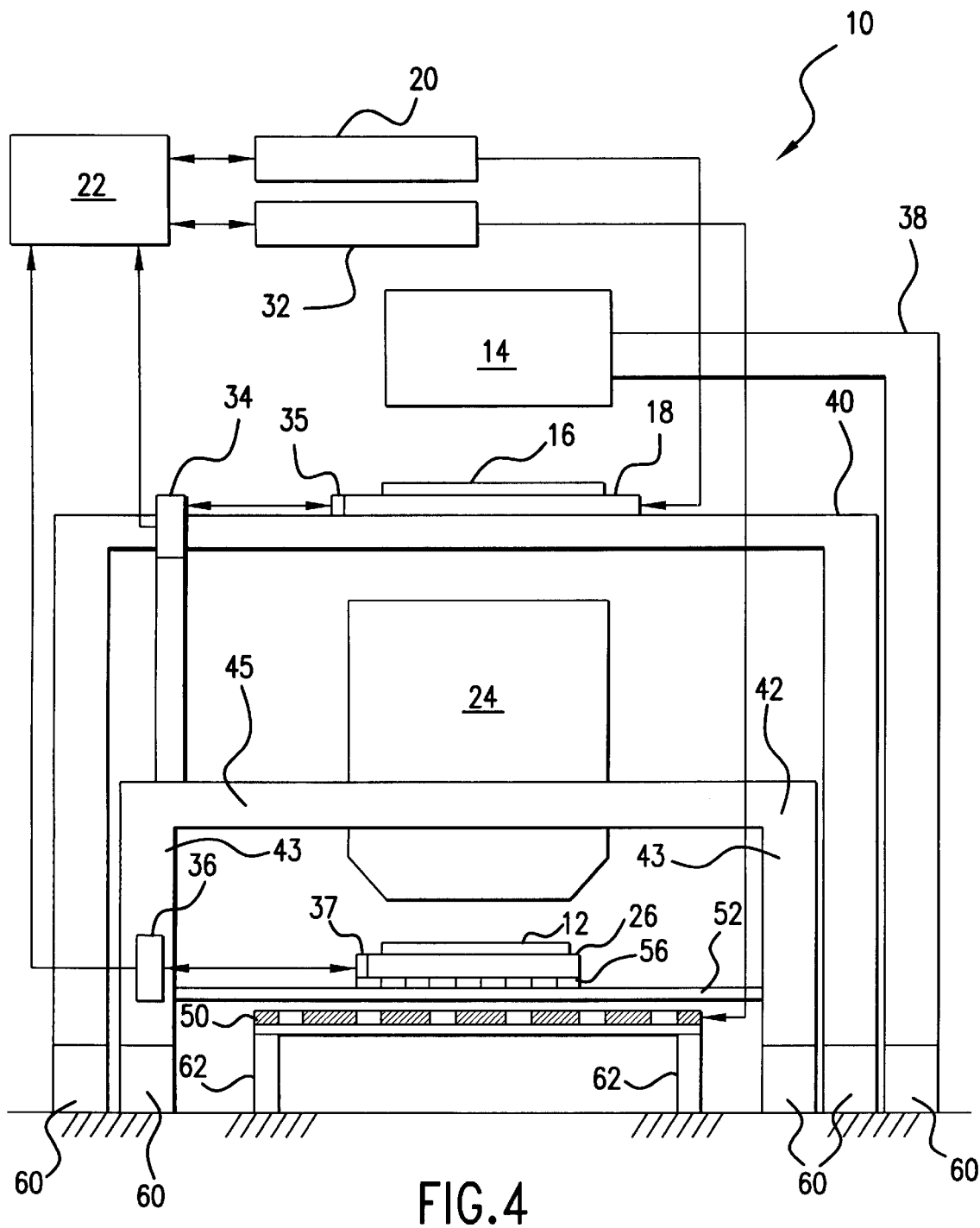
FIG. 4 is a schematic representation of the projection exposure system that implements yet another embodiment of the reaction force isolation system of the present invention in which the top plate of the planar motor is supported by a frame.

In another embodiment of the present invention as illustrated in FIG. 4, the coil array 50 is rigidly supported on the ground on supports 62. In this embodiment, instead of supporting the top plate 52 of the planar motor 30 on support posts 54 on the base 58 as was done in the earlier embodiments, the top plate 52 is supported by frame 42. The invention as illustrated in FIG. 4 does not have the support posts 54. Therefore the top plate 52 may be formed with a thick honeycomb structure or other types of reinforced structure to prevent it from bending. The frame 42 is isolated from vibration transmitted through the ground by damping means 60.

Figure 5:
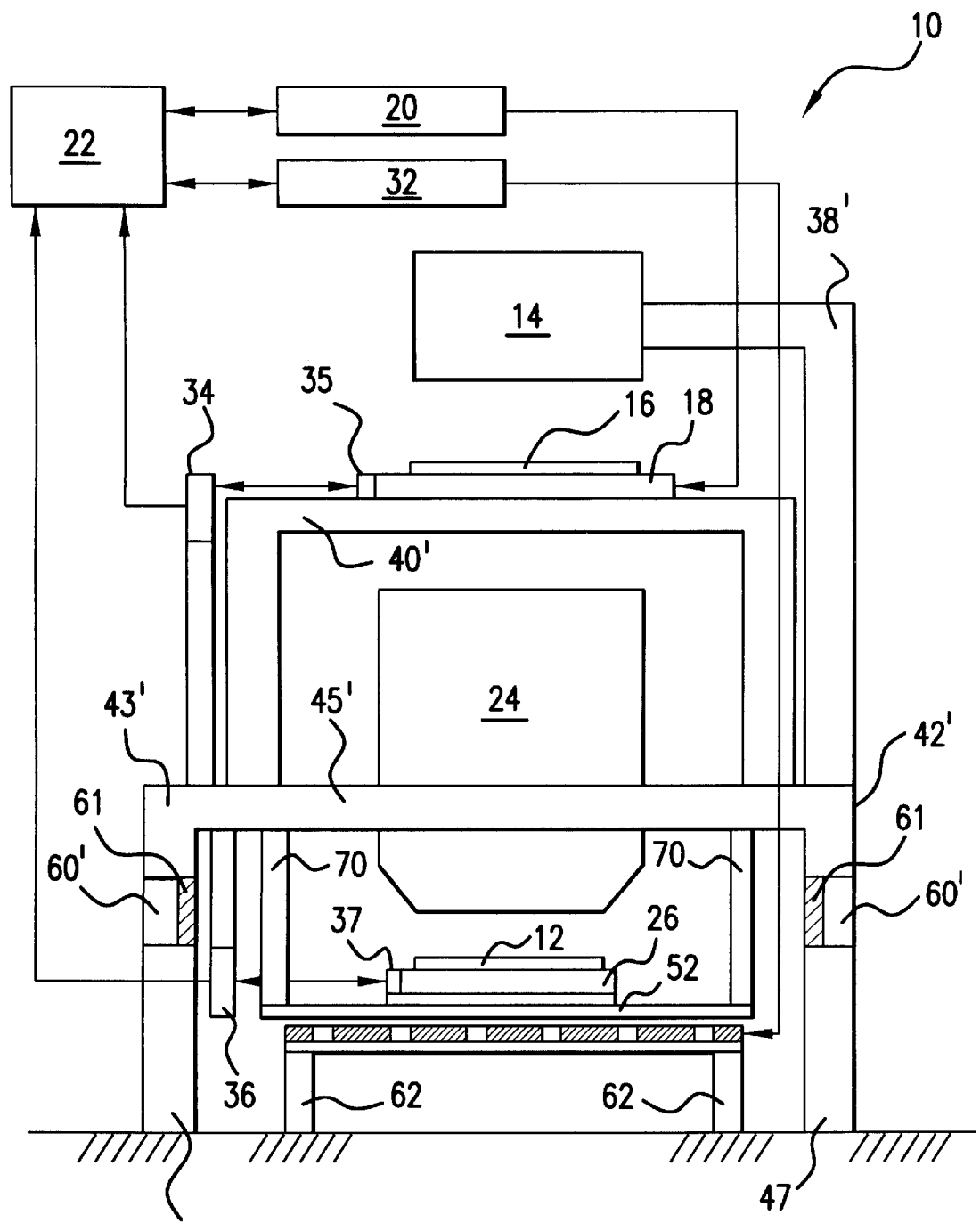
FIG. 5 is a schematic representation of the projection exposure system in which the reaction force isolation system is a variation of the embodiment in FIG. 4.

FIG. 5 illustrates another configuration in which the top plate 52 is supported by fame 42. Unlike FIG. 4 in which the top plate 52 is supported at its ends by the side members 43 of frame 42, the top plate 52 is supported to the top member 45' of the frame 42'. The coil array 50 remains rigidly supported to the ground as in FIG. 4. The frame 42' is mounted on the supports 47 using damping means 60'. The center of gravity of the system 10 is lower in reference to the damping means 60'. So the system 10 in FIG. 5 is less susceptible to vibration than that in FIG. 4. Additionally, in FIG. 5, frames 38' and 40' may be mounted on the frame 42' to avoid the need for additional damping means, as the damping means 60' isolates the combined structures 38', 40' and 42'. The damping means 60' prevents the vibration of the ground from transmitting to the projection optics 24, the illumination system 14 and the reticle 16. The system 10 in FIG. 5 is more compact, but the center of gravity of the system 10 shifts depending on the position of the wafer stage 26. Therefore, it is preferred that the damping means 60' includes an actuator (schematically shown at 61) that maintains the frame 42' level so as to prevent misalignment of the optical axes of the projection optics 24 and the illumination system 14. The actuator and positional feedback scheme needed to achieve the leveling objective may be implemented using known art.

As a further variation of the embodiments of FIGS. 4 and 5, bearing supports may be utilized to support the coil array 50, for the same reasons as for the embodiment of FIG. 3.

Figure 6:
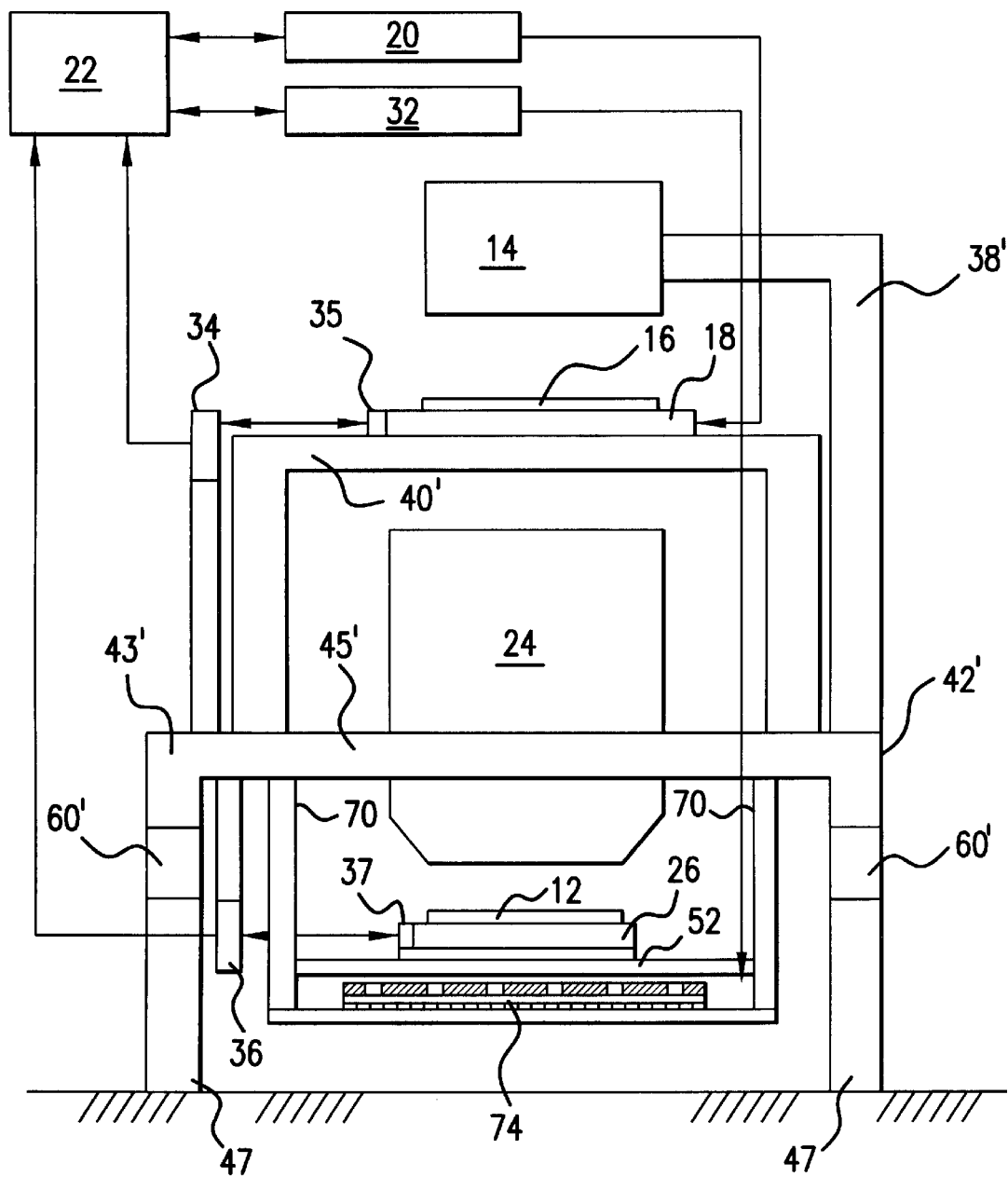
FIG. 6 is a schematic representation of the projection exposure system that implements a reaction force isolation system in which the top plate of the planar motor and the coil array that rides on a bearing are supported on a common support frame.

In yet another embodiment of the present invention as illustrated in FIG. 6, both the top plate 52 and the coil array 50 are supported by the frame 42'. Specifically, the top plate 52 is attached to the mid sections of the vertical members 70 that depend from the top member 45' of the frame 42'. A horizontal support platform 72 is attached to the ends of the vertical members 70. The coil array 50 rides on bearings 74 (e.g. an air or ball bearings) on the horizontal support platform 72. With this embodiment, the reaction forces would cause the coil array 50 to move sideways on its bearings 74, thus absorbing the reaction forces with its inertia. In FIG. 6, frames 38' and 40' may be mounted on the frame 42' without additional damping means as in FIG. 5. In addition, the reaction forces can be absorbed during the exposure process, because reaction forces are very small compared to the weight of the system 10 that comprises the projection optics 24, wafer stage 26, the reticle stage 18 and the illumination system 14.

The invention of FIG. 6 uses the principle of momentum conservation, so the center of gravity of the system 10 does not shift according to the position of the wafer stage 26. Therefore damping means 60' of this invention does not need an actuator (compared to the embodiment in FIG. 5.)

Figure 7:
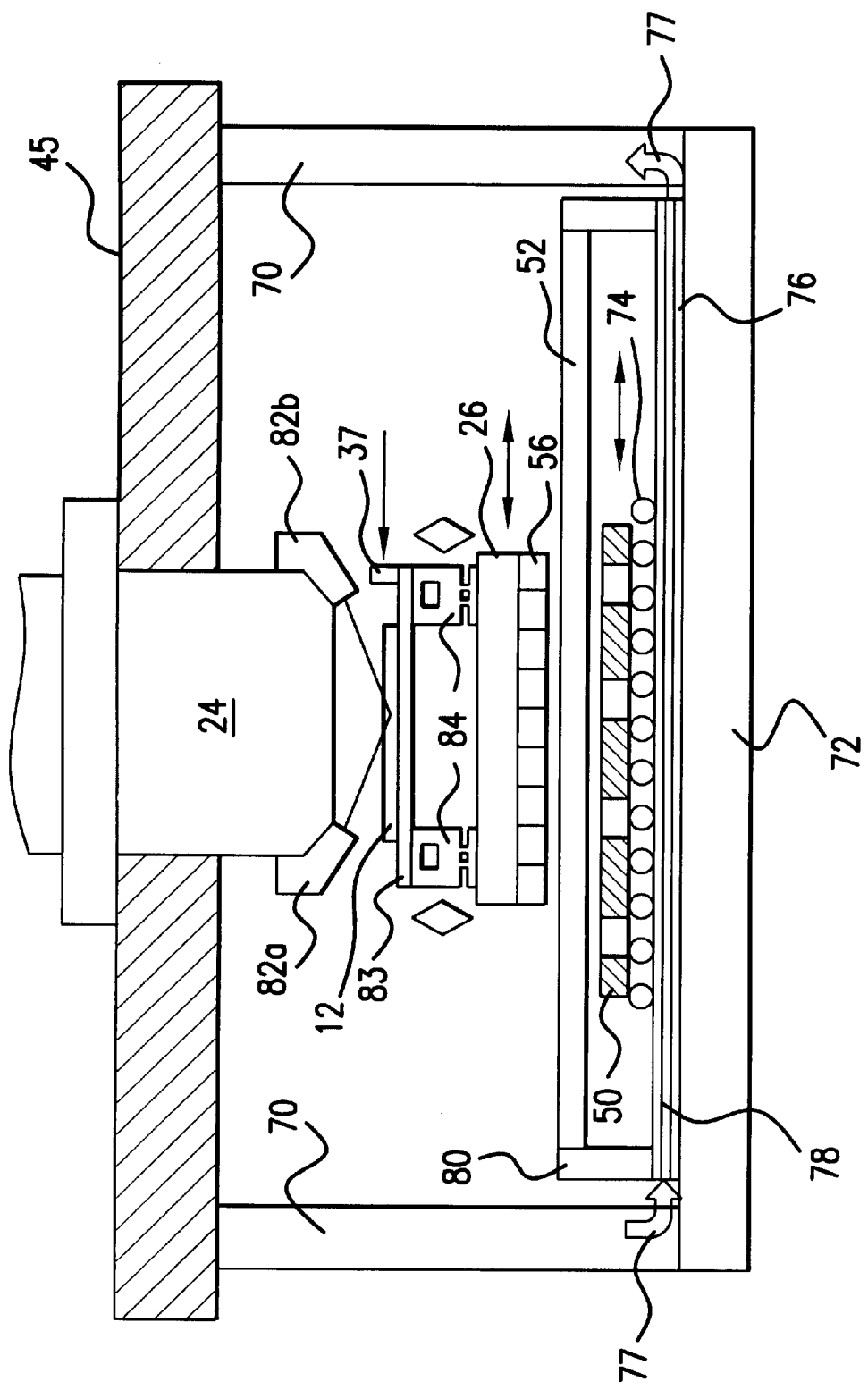
FIG. 7 is a schematic representation of a further embodiment of the reaction force isolation system of the present invention which also shows a wafer leveling stage and the planar motor is cooled by coolant.

FIG. 7 shows a variation of the embodiment of FIG. 6. The planar motor 30 includes a cooling platform 76 that is supported by the horizontal support platform 72. The cooling platform 76 includes conduits 78 through which coolant 77 can pass through. Alternatively, Peltier cooling or ventilating air cooling may be deployed. The top plate 52 is supported on stands 80 that are supported on the cooling platform 76. The cooling platform 76 provides a support surface on which the coil array 50 rests on bearings 74. Further wafer stage 26 includes a leveling stage 83 that positions the wafer 12 in three additional degrees of freedom. The leveling stage 83 has at least three actuators 84, e.g. voice coil motors, which actuate in the direction of the axis of projection optics 24 in accordance with focus sensors 82a and 82b. The focus sensor 82a emits a focusing beam to the wafer 12 and the focus sensor 82b receives the reflected beam from the wafer 12. The leveling stage 83 can adjust the focal plane of the projection optics 24 to align with the surface of the wafer 12. It is preferable that the leveling stage 83 is structurally isolated (without mechanical contact) on the wafer stage 26 so that the vibration of the wafer stage 26 (e.g., caused by the air bearing) may be isolated.

While the invention has been described with respect to the described embodiments in accordance therewith, it will be apparent to those skilled in the art that various modifications and improvements may be made without departing from the scope and spirit of the invention. For example, in the above embodiments of FIGS. 1, 3 and 4, frames 38, 40 and 42 are separately coupled to the ground. Alternatively, frames 38 and 40 can be mounted on the frame 42 without damping means as in FIGS. 5 and 6. Conversely, the frames 38', 40' and 42' in the embodiments of FIGS. 5, 6 and 7 may be separately supported on damping means as in FIGS. 1, 3 and 4. The above embodiments of FIGS. 1, 3, 4 and 5 also may be implemented with focus sensors 82 and the leveling stage 83. Additionally, various combinations of damping means and bearing support may be deployed to provide the reaction force isolation function, and/or to provide redundancy in such function. Further, the present invention may be adopted in other types of exposure apparatus and other types of processing systems in which precision positioning utilizing a planar motor is desired. While the described embodiment illustrates planar motors used in an X-Y plane, planar motors used in other orientations and more or less dimensions may be implemented with the present invention. Accordingly, it is to be understood that the invention is not to be limited by the specific illustrated embodiments, but only by the scope of the appended claims.

What is claimed is:

1. A stage device, comprising:
   a planar motor which has a fixed portion and a moving portion, wherein said moving portion supports an article for movement in a plane of the planar motor; and
   a vibration isolation structure structured and configured to isolate vibration from the moving portion which is induced by a reaction force between said moving portion and said fixed portion.

2. A stage device according to claim 1, wherein said moving portion is supported on a stationary support, and said vibration isolation structure includes a structure in which said fixed portion is structurally independent of said stationary support.

3. A stage device according to claim 2, wherein said fixed portion is supported on a bearing.

4. A stage device according to claim 3, wherein said bearing comprises an air bearing and/or a ball bearing.

5. A stage device according to claim 2, wherein said vibration isolation structure further comprises a vibration isolation device that supports said stationary support.

6. A stage device according to claim 5, wherein said vibration isolation device includes an air damper and/or an actuator.

7. A stage device according to claim 2, wherein said stationary support comprises a top plate on which the moving portion is supported for movement and a base, and said fixed portion is located between said top plate and said base.

8. A stage device according to claim 7, wherein said fixed portion includes a coil array.

9. A stage device according to claim 7, wherein said top plate is made of a non-magnetic material.

10. A stage device according to claim 7, wherein the stationary support further comprises a support structure between said top plate and said base for keeping said top plate from bending.

11. A stage device according to claim 2, wherein said moving portion moves on a bearing surface.

12. A stage device according to claim 11, wherein said bearing surface includes an air bearing.

13. A stage device according to claim 2, further comprising a control device for controlling the positions of said moving portion at least in two directions.

14. A stage device according to claim 13, wherein said fixed portion includes a coil array, and said control device includes a driver unit for supplying a current to said coil array to move the moving portion.

15. A stage device according to claim 13, further comprising at least two interferometers, wherein said control device controls the positions of said moving portion based in part on the outputs of said interferometers.

16. A stage device according to claim 13, further comprising at least three inteferometers, wherein said control device controls the X, Y and θ positions of said movable stage based in part on the outputs of said interferometers.

17. A stage device according to claim 1, wherein said moving portion includes a permanent magnet.

18. A stage device according to claim 2, wherein said stationary support includes a platform on which the moving portion is supported for movement and a frame that supports said platform, and wherein said fixed portion is located beneath said platform.

19. A stage device according to claim 18, wherein said frame is supported on a damping device.

20. A stage device according to claim 19, wherein said damping device comprises an actuation means for maintaining the frame level against any changes induced by a change in center of gravity.

21. A stage device according to claim 1, wherein said fixed portion and said moving portion are supported by a same frame, and wherein the fixed portion is supported on a bearing.

22. A stage device according to claim 21, wherein said frame is supported on a damping device.

23. A stage device according to claim 21, wherein the moving portion comprises a leveling stage for leveling said article.

24. A stage device according to claim 21, wherein the frame comprises a platform on which the fixed portion is supported, and means for cooling said platform.

25. An exposure apparatus, comprising:

an optical system for imaging a mask pattern onto an article;

a stage device for precise positioning of the article for imaging, said stage device comprising:

a planar motor which has a fixed portion and a moving portion, wherein said moving portion supports said article for movement in a plane of the planar motor; and a vibration isolation structure structured and configured to isolate from the moving portion vibration that is induced by a reaction force between said moving portion and said fixed portion.

26. An exposure apparatus according to claim 25, further comprising means for scanning said mask pattern in synchronization with movement of said article.

27. An exposure apparatus according to claim 26, wherein said mask pattern is a circuit pattern for a semiconductor device and wherein said article to be exposed is a wafer.

28. A method of controlling a stage device, comprising the steps of:

providing a planar motor which has a fixed portion and a moving portion;

supporting said article on said moving portion for movement in a plane of the planar motor; and providing a vibration isolation structure that is structured and configured to isolate vibration from the moving portion which is induced by a reaction force between said moving portion and said fixed portion.

* * * * *